(12) United States Patent
Nandi et al.

(10) Patent No.: US 9,389,276 B2
(45) Date of Patent: Jul. 12, 2016

(54) FAULT DIAGNOSIS OF ELECTRIC MACHINES

(76) Inventors: Subhasis Nandi, Victoria (CA); Ilamparithi Thirumarai Chelvan, Victoria (CA)

(*) Notice: Subject to any disclaimer, the term of this patent is extended or adjusted under 35 U.S.C. 154(b) by 697 days.

(21) Appl. No.: 13/525,089

(22) Filed: Jun. 15, 2012

(65) Prior Publication Data

US 2013/0338939 A1     Dec. 19, 2013

(51) Int. Cl.
 *G01R 31/34* (2006.01)

(52) U.S. Cl.
 CPC ............ *G01R 31/343* (2013.01); *G01R 31/346* (2013.01)

(58) Field of Classification Search
 CPC .... G01R 31/343; G01R 31/346; G01R 31/34; G01R 31/06; G01H 1/003; G01H 1/006; G01M 13/04; H02P 29/021; H02P 29/013; H02P 23/14; H02P 21/14; H02P 21/141; H02P 2207/05
 USPC .......... 702/38, 35, 57–58, 64–65, 75–77, 81, 702/84–85, 106, 127, 182–183, 185, 189; 310/10, 12.18; 318/700, 727; 324/500, 324/545–546, 765.01; 73/659–660
 See application file for complete search history.

(56) References Cited

PUBLICATIONS

Nandi et al., Detection of Eccentricity Faults in Induction Machines Based on Nameplate Parameters, May 2011, IEEE Transactions on Industrial Electronics, vol. 58, No. 5, pp. 1673-1683.*
Metatla et al., Eccentricity Fault Monitoring by Analysis Stator Phase Currents, Aug. 2010, International Review on Modelling and Simulations (I.RE.MO.S.), vol. 3, No. 4, pp. 533-537.*
Hyun et al., Automated Monitoring of Airgap Eccentricity for Inverter-Fed Induction Motors under Standstill Conditions, 2010 IEEE, pp. 2485-2492.*
Bruzzese et al., "Harmonic signatures of static eccentricities in the stator voltages and in the rotor current of no-load salient-pole synchronous generators," *IEEE Trans. Industrial Electronics*, 58(5):1606-1624 (May 2011).
Ebrahimi et al., "Static-eccentricity, dynamic-eccentricity, and mixed-eccentricity fault diagnoses in permanent magnet synchronous motors, " *IEEE Trans. Industrial Electronics*, 56(11):4727-4739 (Nov. 2009).
Nandi et al., "Mixed eccentricity in three phase induction machines: Analysis, simulation and experiments," *Conf. Rec. IEEE-IAS Annual Meeting*, Pittsburgh, PA, 3:1525-1532 (Oct. 2002).

* cited by examiner

*Primary Examiner* — Toan Le
(74) *Attorney, Agent, or Firm* — Klarquist Sparkman, LLP

(57) ABSTRACT

Faults and fault types in electric machines can be identified based on spectra associated with stator and field currents. Signals associated with such currents can be compensated for line variations, and spectral contributions for non-eccentric machines can be reduced or eliminated to permit distinguish static eccentricities from non-eccentric machine operation. One or more of a static eccentricity, a dynamic eccentricity, and a mixed eccentricity can be identified based on spectral component magnitudes at selected frequencies.

24 Claims, 14 Drawing Sheets

FAULT DIAGNOSIS OF ELECTRIC MACHINES

FIELD

The technology relates to a fault detection system using motor current signature analysis. More specifically, the technology relates to a method and system for eccentricity fault detection.

BACKGROUND

A certain degree of asymmetry always exists even in a newly manufactured machine. If the percentage of asymmetry exceeds 10% of the nominal air gap length, the machine is said to be eccentric. Eccentricity results in excessive noise, vibration, higher torque ripple, increased electromagnetic stress, increased temperature and in the worst case causes a stator rotor rub. Due to such detrimental effects, monitoring the motor for eccentric conditions gains paramount significance.

A theoretical background for current signature based eccentricity detection in induction motors has been provided by S. Nandi, R. M. Bharadwaj and H. A. Toliyat in "Mixed eccentricity in three phase induction machines: Analysis, simulation and experiments," published in *Conf. Rec. IEEE-IAS Annual Meeting*, Pittsburgh, Pa., vol. 3, pp. 1525-1532, October 2002. A modified winding function approach (MWFA) based modeling of machines reported in this work has been used in the field of condition monitoring for many subsequent researches.

In the field of synchronous machines, an index for non-invasive diagnosis of eccentricity in permanent magnet machines has been proposed by B. M. Ebrahimi, J. Faiz and M. J. Roshtkhari in "Static-eccentricity, dynamic-eccentricity, and mixed-eccentricity fault diagnoses in pelitianent magnet synchronous motors," published in *IEEE Trans. Industrial Electronics*, vol. 56, no. 11, pp. 4727-4739, November 2009. As all types of eccentricities affected the same frequency components the authors had to resort to k-Nearest Neighbour classifier and three-layer Artificial Neural Network to detect the type and degree of eccentricity. The network was trained using 280 current vectors out of a total population of 400 current vectors.

C. Bruzzese and G. Joksimovic have identified the harmonic components present in the rotor field and stator voltages of a no-load salient pole synchronous generator in "Harmonic signatures of static eccentricities in the stator voltages and in the rotor current of no-load salient-pole synchronous generators," published in *IEEE Trans. Industrial Electronics*, vol. 58, no. 5, pp. 1606-1624, May 2011. The effect of the stator magneto-motive force (MMF) has not been included as the authors have focused their attention on synchronous generator operating at no-load. In case of a synchronous motor, the effect of the stator MMF can play a very significant role in the generation of eccentricity related harmonics.

None of the contemporary works have taken into consideration the effect of supply unbalance, supply harmonics, constructional asymmetry etc. Accordingly, there is a need for a method to determine the specific harmonic components in the motor current spectrum, which will indicate the type and the degree of eccentricity fault under any level of load, supply unbalance and internal asymmetry of the machine.

SUMMARY

In some examples, methods of detecting air gap eccentricity and stator inter-turn faults in a multi-phase electric machine include determining a spectral magnitude at a selected fault frequency based on at least one of a stator current and a field current, and indicating a fault based on the determined spectral magnitude and the selected fault frequency. In some embodiments, a residue correction is applied to the spectral magnitude, wherein the fault is determined based on the residue-corrected spectral magnitude. In other examples, the residue correction is based on spectral characteristics corresponding to a non-eccentric multi-phase machine. According to some embodiments, the spectral magnitude is associated with a frequency associated with a dynamic eccentricity, and the residue correction is based on a spectral magnitude corresponding to an air gap lacking static eccentricity. In typical examples, the indicated fault is associated with an air gap eccentricity such as a dynamic air gap eccentricity, a static air gap eccentricity, or a mixed static and dynamic air gap eccentricity. In other embodiments, the indicated fault is associated with an inter-turn short circuit. In some examples, a fault frequency is selected based on a fault to be identified such as a static eccentricity, a dynamic eccentricity, or a mixed eccentricity. In some particular examples, the selected fault frequency is $$f_{fault} = \left(n \pm 6h \pm \frac{km}{p}\right)f,$$

wherein n=1, 5, 7, 11, 13 ..., m is a non-negative even integer for static eccentricity, m is a positive integer for mixed eccentricity, p is a fundamental pole pair number, f is a stator line frequency, and k and h are non-negative integers. The disclosed methods can be implemented on a computing system with computer executable instructions stored on a computer-readable medium.

Apparatus, comprise a signal processor configured to estimate a spectral magnitude associated with at least one of a stator current and a field current of an induction machine, and based on the estimated spectral magnitude, identify at least one of a static eccentricity, a dynamic eccentricity, and a mixed eccentricity. In some examples, the signal processor is configured to identify at least one of a static eccentricity, a dynamic eccentricity, and a mixed eccentricity based on the spectral magnitude and frequency at associated fault frequencies. In some examples, a signal conditioner is configured to couple an electrical signal associated with at least one of the stator current and the field current to the signal processor, typically as a digitized electrical signal. According to representative embodiments, the signal processor is configured to obtain a Fourier transform of the electrical signal and estimate the spectral magnitude based on the Fourier transform. In some examples, the signal processor is configured to estimate a contribution of an eccentric condition to the spectral magnitude based on a contribution associated with a non-eccentric condition. According to some examples, the signal processor is configured to estimate the spectral magnitude associated with at least one of the stator current and the field current based on a stator voltage.

Methods comprise obtaining a spectral magnitude associated with at least one of a stator current and a field current in a motor, and based on the spectral magnitude and at least one fault frequency, identifying an eccentricity type in a motor. In some embodiments, the identified type is at least one of a static eccentricity, a dynamic eccentricity, and a mixed eccentricity. In particular examples, the at least one fault frequency is $$f_{fault} = \left(n \pm 6h \pm \frac{km}{p}\right)f,$$

wherein n=1, 5, 7, 11, 13 ..., m is a non-negative even integer for static eccentricity, m is a positive integer for mixed eccentricity, p is a fundamental pole pair number, f is a stator line frequency, k and h are non-negative integers.

The present technology is capable of detecting eccentricity fault in a three-phase electric machine, which is rotating in nature. The inverse air gap of the machine, which gets affected by eccentricity, has been modeled using a binomial series expression for the first time. The major advantages of such a representation are (i) the expression can be generalized to deal with any type of multi-phase rotating machines such as induction machines and synchronous machines, both round rotor and salient pole types, and (ii) the expression will constitute constant coefficient co-sinusoidal terms that can identify eccentricity specific frequency components in the line current spectrum when multiplied with magneto-motive force in the machine.

In order to use the present technology, no intrusive sensors are necessary. Only line currents and line to line voltages need to be monitored and fed through a data acquisition system for analysis using a computer program or dedicated processing system. For machines having external field connections, field current data can also be acquired. This program enables real time visualisation of the captured quantities in the frequency domain. The end user needs to focus on the modulation of the amplitude of the fault specific frequency components in the spectrum. These modulations can be rise, fall, presence and/or absence of the fault specific frequency components. The type of eccentricity can be accurately predicted by observing these modulations. In some examples, some or all of line currents, line voltages, field currents, or other such currents or voltages are estimated or measured.

The typical fault frequencies in the stator line current spectrum and where applicable, the field current spectrum can be defined as:

$$f_{ste} = \left(n \pm 6h \pm \frac{km}{p}\right)f$$

$$f_{rte} = \left(\pm 6h \pm \frac{km}{p}\right)f$$

wherein $f_{ste}$ is a frequency of the harmonic component present in the stator current under different eccentric conditions, $f_{rte}$ is a frequency of the harmonic component present in the field current under different eccentric conditions, f is a stator line frequency, n=1, 5, 7, 11, 13, . . . ; h=1, 2, 3 . . . ; k=0, 1, 2, 3 . . . ; m=0 for healthy and dynamic eccentric condition, m=0, 2p, 4p, . . . for static eccentric conditions and m=0, 1, 2, 3 . . . for mixed eccentric conditions, and p is a fundamental pole pair number.

For inter-turn short-circuit faults on a multi-phase stationary stator winding of electric machines, fault specific frequencies in the motor line currents are similar to $f_{ste}$ corresponding to static eccentricity fault frequencies given above. Under short-circuit faults also modulations of the amplitude of these fault specific components occur. These modulations can be rise, fall, presence and/or absence of the fault specific components. Thus, in some exceptions, the described methods and approaches can be configured to diagnose stator inter-turns faults as well.

These and other aspects of the disclosed technology are set forth below with reference to the accompanying drawings.

DETAILED DESCRIPTION

As used in this application and in the claims, the singular forms "a", "an" and "the" include the plural forms unless the context clearly dictates otherwise. Additionally, the term "includes" means "comprises". The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods and apparatus can be used in conjunction with other systems, methods and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Experimental results for representative approaches were obtained by inserting customized bushings with a bearing in a 3 hp synchronous motor. A comparative study of the characteristic frequency components was completed with different types and levels of eccentricity faults and supply unbalance. Firstly, the inverse of the air gap length of the machine over the entire inner periphery of the stator (known as the inverse air gap function) was represented using a binomial expression. Secondly, using this binomial expression, various equations were developed to predict the harmonics best suited for detecting different types of eccentricity faults (static eccentricity, dynamic eccentricity and mixed eccentricity) in any synchronous machine. The utility of the equations were then verified.

Example 1

(i) Description of Motor and Selection of Fault

Figure 1:
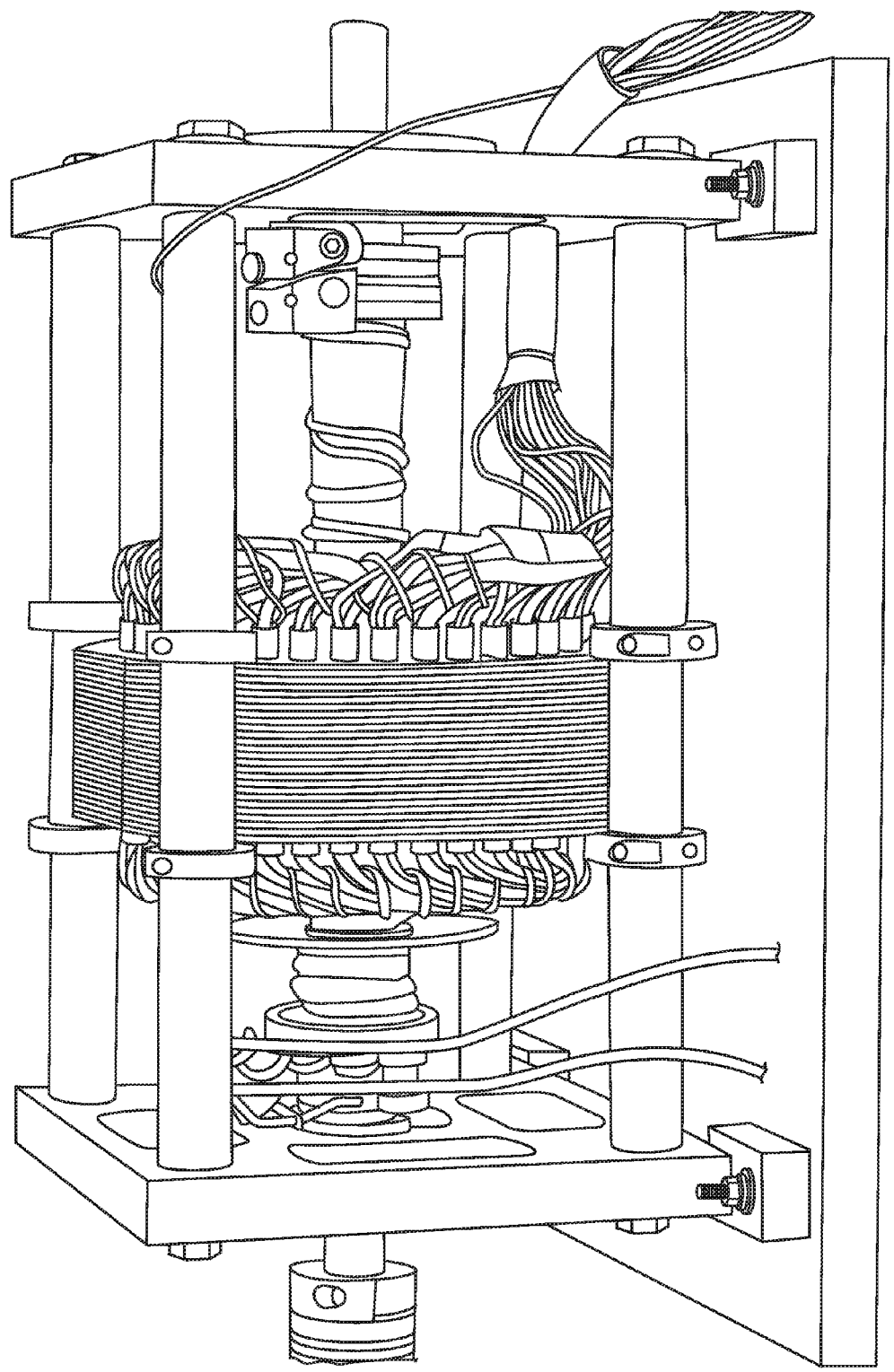
FIG. 1 is a side-view of an experimental synchronous motor with modified enclosure.
Figure 2:
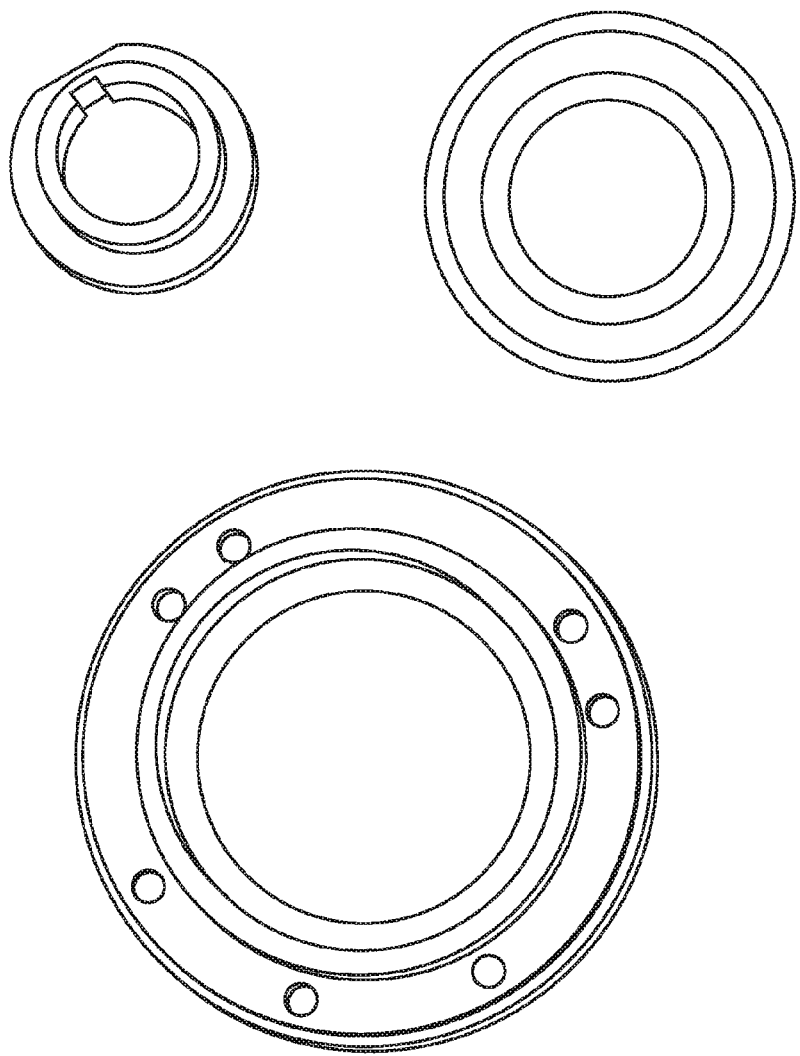
FIG. 2 illustrates a new bearing along with a set of eccentric bushings for physically implementing eccentricity faults on a healthy synchronous machine.

A salient pole synchronous motor was used for the experiments. It was a 208 V, 1800 rpm, 60 Hz, 3 hp, 3-phase, 4-pole star connected machine, with a nominal air gap length of 0.6 mm along d-axis and 40.27 mm along q-axis. The enclosure of the machine was modified so as to facilitate air gap measurements using a feeler gauge. The bearings and end bells were also changed. Two sets of eccentric bushings, each offset by 16.67%, 33.34% and 50% of the air gap, were used to obtain different combinations of static, dynamic and mixed eccentricity conditions. FIG. 1 shows the modified enclosure whereas a new bearing along with a set of eccentric bushings are shown in FIG. 2.

(ii) Mechanism of Induction of Harmonics in the Stator Line Current Under Healthy Condition The stator MMF produced by a balanced three phase sinusoidal supply is given by (1)

$$F_s = \Sigma_{n=1,5,7,11,\ldots}^{\infty} M_{sn} \cos [np\phi \pm \omega t], \tag{1}$$

wherein p is the number of fundamental pole pairs (half the number of fundamental poles), $\phi$ is the stator space angle, and $M_{sn}$ is a real number. The specific permeance function $P_h$ of a healthy multi-phase rotating electromechanical machine was represented as in (2). This can be obtained by multiplying the ideal representation of the inverse air gap function, as shown in (18), with permeability of air.

$$P_h = \Sigma_{q=0,2p,4p,\ldots}^{\infty} P_{hq} \cos [q(\phi - \theta_r)] \tag{2}$$

where $\theta_r$ is the rotor position with respect to stator and $P_{hq}$ is a real number.

The flux density produced due to the interaction of the stator MMF and the specific permeance function can be expressed as $$B_{sn} = M_{sn} P_{hq} \cos [np\phi \pm \omega t] \cos [q(\phi - \theta_r)]. \tag{3}$$

High frequency currents were induced in the damper bars of the synchronous machine because of (3). These circulating currents generated an MMF, which was given with respect to the rotor as $$F_{rn} = M_m \cos[(m_1)\varphi' \pm 6h\omega t + \theta_1]; m_1 = 1, 2, 3\ldots, h = 1, 2, \tag{4}$$

$$3, \cdots, \varphi' = \varphi - \omega_r t, \omega_r = \frac{\omega}{p}, \theta_r = \omega_r t. M_m \text{ is a real number}$$

The MMF so produced reacted with the specific permeance function (2) and resulted in another flux density. Thus, with respect to stator frame of reference the total flux density in the air-gap was represented by (5).

$$B_{sm} = \frac{1}{2} M_{sm} P_{hq} \cos\left\{(m_1+q)\varphi - \left(\pm 6h + \frac{m_1+q}{p}\right)\omega t + \theta_1\right\} + \frac{1}{2} M_{sm} P_{hq} \cos\left\{(m_1-q)\varphi - \left(\pm 6h + \frac{m_1-q}{p}\right)\omega t + \theta_1\right\} \quad (5)$$

where is a real number.

Current in the stator winding was induced due to the flux density given above if and when the pole pair numbers $(m_1 \pm q)/p$ of (5) matched with n of (1). Thus, the frequencies of such induced currents were obtained using (6).

$$f_{he} = (n \pm 6h)f;\ n=1,5,7\ldots;\ h=1,2,3 \quad (6)$$

For example, if n=1, h=1; then $f_h$=5f, +7 f and if n=1, h=2; then $f_h$=−11f, +13f. Ideally, a healthy salient pole synchronous machine was found to contain all odd harmonics except the triple harmonics.

(iii) Mechanism of Induction of Harmonics in the Stator Line Current Under Static Eccentric (SE) Condition The specific permeance function of a multi-phase rotating electromechanical machine under static eccentric condition was represented as in (7).

$$P_{se} = \Sigma_{l=0,1,2,3}\ldots {}^{\infty}\Sigma_{m=0,2p,4p}\ldots {}^{\infty}P_{selm} \cos(l\phi \pm m\theta_r) \quad (7)$$

where $P_{selm}$ is a real number.

When the stator MMF of (1) interacted with the SE permeance function (7), it resulted in a flux density in the air-gap, which with respect to stator was given by (8).

$$B_{sen} = M_{sen} P_{selm} \cos[np\phi \pm \omega t] \cos[l\phi \pm m\theta_r]. \quad (8)$$

$M_{sen}$ is a real number.

The above flux density induced currents in the rotor bars that resulted in a rotor MMF expressed using (9).

$$F_{ren} = M_{ren} \cos\left[(m_1)\varphi' + \left(\pm 6h + \frac{\pm l \pm m}{p}\right)\omega t + \theta_2\right]; \quad (9)$$

$M_{ren}$ is a real number.

The MMF so produced reacted with the SE specific permeance function (7) and resulted in another flux density. Thus, with respect to stator frame of reference the total flux density in the air-gap can be represented by (10):

$$B_{srsen} = \quad (10)$$

$$\frac{1}{2} M_{sren} P_{selm} \begin{bmatrix} \cos\left\{(m_1+l)\varphi - \left(\pm 6h + \left(\frac{m_1 \pm l}{p}\right) \pm \frac{km}{p}\right)\omega t + \theta_2\right\} + \\ \cos\left\{(m_1-l)\varphi - \left(\pm 6h + \left(\frac{m_1 \pm l}{p}\right) \pm \frac{km}{p}\right)\omega t + \theta_2\right\} \end{bmatrix}$$

where $M_{sren}$ is a real number.

Current in the stator winding was induced under SE condition due to the flux density given above if and when the pole pair numbers $(m_1 \pm l)/p$ of (10) matched with n of (1). Thus, the frequencies of such induced currents were obtained using (11).

$$f_{se} = \left(n \pm 6h \pm \frac{km}{p}\right)f;\ \text{where } n, h \text{ as in (6);} \quad (11)$$

$$k = 0, 1, 2\ldots;\ m = 0, 2p, 4p, \ldots$$

For example, if n=1, h=1, m=4, p=2, k=2; then $f_{se}$=(1±6±4)f=−9f, −f, +3f, +11f and if n=1, h=2, m=4, p=2, k=2; then $f_{se}$=(1±12±4)f=−15f, =7f, +9f, +17f. Thus, it is evident that SE introduced triplen harmonics in the line current spectrum in addition to other odd harmonics.

(iv) Mechanism of Induction of Harmonics in the Stator Line Current Under Dynamic Eccentric (DE) Condition The specific permeance function of a multi-phase rotating electromechanical machine under dynamic eccentric condition was represented as in (12).

$$P_{de} = \Sigma_{m=0,1,2,3}\ldots {}^{\infty}P_{dem} \cos\{m(\phi-\theta_r)\} \quad (12)$$

When the stator MMF of (1) interacted with the DE permeance function (12), it resulted in a flux density in the air-gap. This flux density induced circulating currents in the rotor bars that resulted in a rotor MMF. This rotor MMF interacted with the DE permeance function (12) resulting in another flux density in the air gap. Hence, with respect to the stator frame of reference, the total air gap flux density was represented by (13):

$$B_{srden} = \frac{1}{2} M_{srden} P_{dem} \begin{bmatrix} \cos\left\{(m_1+l)\varphi - \left(\pm 6h + \left(\frac{m_1 \pm l}{p}\right)\right)\omega t + \theta_3\right\} + \\ \cos\left\{(m_1-l)\varphi - \left(\pm 6h + \left(\frac{m_1+l}{p}\right)\right)\omega t + \theta_3\right\} \end{bmatrix} \quad (13)$$

$M_{srden}$, $P_{dem}$ are real numbers.

When the pole pair numbers $(m_1 \pm l)/p$ of the flux density in (13) matched with n of (1), currents were induced in the stator windings. The frequencies of these currents were computed using (14).

$$f_{de} = (n \pm 6h)f;\ n=1,5,7\ldots;\ h=1,2,3 \quad (14)$$

For example, if n=1, h=1; then $f_{de}$=−5f, +7f and if n=1, h=2; then $f_{de}$=−11f, +13f. Thus, it is evident that DE did not introduce any additional harmonic components as SE. Instead it only modified the existing odd harmonics of the healthy machine.

(v) Mechanism of Induction of Harmonics in the Stator Line Current Under Mixed Eccentric (ME) Condition The specific permeance function of a multi-phase rotating electromechanical machine under mixed eccentric condition was represented as in (15):

$$P_{me} = \Sigma_{l=0,1,2,3}\ldots {}^{\infty}\Sigma_{m=0,1,2,3,}\ldots {}^{\infty}P_{melm} \cos(l\phi \pm m\theta_r) \quad (15)$$

where $P_{melm}$, is a real number.

Following similar mathematical derivations as before, the interaction of the MMF (1) with the specific permeance (15)

resulted in components in the line current of the faulty machine given as:

$$f_{me} = \left(n \pm 6h \pm \frac{km}{p}\right)f; m = 0, 1, 2, 3...; n, h, k \text{ as in (11)} \quad (16)$$

For example, if n=1, h=1, k=1, m=1, p=2; then
$f_{me}$=−5.5f, −4.5f, +6.5f, +7.5f and if n=1, h=1, k=5, m=2, p=2; then
$f_{me}$=−10f, 0f, +2f, +12f. The line current spectrum was found to consist of all harmonics, both even and odd. Moreover, side band components were also predicted under ME fault.

TABLE I

FIRST FEW HARMONIC COMPONENTS OF STATOR LINE CURRENT PHASOR UNDER DIFFERENT CONDITIONS

| HE | +1f | −5f | +7f | −11f | +13f | −17f |
|---|---|---|---|---|---|---|
| SE | ±1f | ±3f | ±5f | ±7f | ±9f | ±11f |
| DE | +1f | −5f | +7f | −11f | +13f | −17f |
| ME | ±0.5f | ±1f | ±1.5f | ±2f | ±2.5f | ±3f |

Example 2

(i) Derivation of Binomial Series Based Inverse Air Gap Function

Conventionally, the inverse air gap function, which was needed for obtaining the specific permeance function of any rotating electric machines, had been modeled using Fourier series. However, the major disadvantage in this approach was the presence of the coefficients in the inverse air gap function as rotor position dependent non-linear functions. This made it impossible to explicitly predict the fault related harmonics in the stator line current under different types of eccentricity conditions. So in this present work, a binomial series based air gap function had been developed for healthy and eccentric cases, where the coefficients of the trigonometric terms were all constants. Hence, simple and accurate predictions of fault related harmonics were possible.

Figure 3:
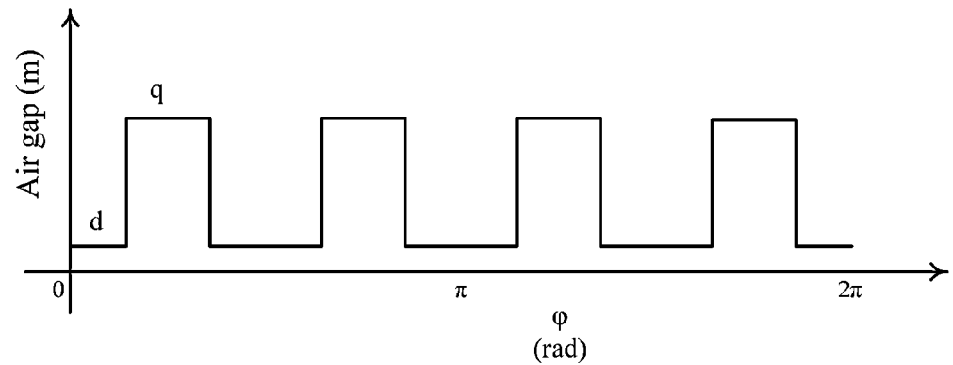
FIG. 3 shows an air gap function of a healthy salient pole synchronous machine $g_h(\phi, \theta_r)$ for $\theta_r$=0. Effective d-axis air gap length=d meters; effective q-axis air gap length=q meters.

Mixed eccentric condition had been considered as the generalized case, as healthy condition, static eccentricity and dynamic eccentricity were treated theoretically as special cases of the mixed eccentric case itself. The air gap function of a machine with mixed eccentricity was given by (17).

$$g_{me}(\phi,\theta_r)=g_h(\phi,\theta_r)-a_s \cos\phi - a_d \cos(\phi-\theta_r) \quad (17)$$

where $\phi$=angular reference in stator, $\theta_r$=rotor position with respect to stator, $a_s$=absolute value of SE and $a_d$=absolute value of DE and $g_h(\phi,\theta_r)$=air gap of a healthy machine. The air gap function of the healthy machine is described by (18). Here p=number of pole pairs. Note that it is a rectangular function as shown in FIG. 3.

$$g_h(\phi,\theta_r)=\Sigma_{q=0,2p,4p,6p...}^\infty A_{hq}\cos\{q(\phi-\theta_r)\} \quad (18)$$

In (17), two new parameters $a_1$ and $a_2$ were introduced, which were $$a_1 = \frac{a_s}{g_h(\varphi,\theta_r)}; a_2 = \frac{a_d}{g_h(\varphi,\theta_r)} \quad (19)$$

Thus, (17) was rewritten as shown in (20). This equation was used for representing the air gap function for any type of eccentricity later on.

$$g_{me}(\phi,\theta_r)=g_h(\phi,\theta_r)[1-a_1\cos\phi - a_2\cos(\phi-\theta_r)] \quad (20)$$

In case of pure static eccentricity, $a_2$ vanishes and therefore (20) is modified $$g_{se}(\phi,\theta_r)=g_h(\phi,\theta_r)[1-a_1\cos\phi] \quad (21)$$

For preventing stator-rotor rub or for maintaining possible running condition, 0≤$a_1$≤1, which implied that $a_1 \cos(\phi)$<1. Therefore, the inverse air gap function $g_{se}^{-1}(\phi,\theta_r)$ was expressed as a binomial series:

$$g_{se}^{-1}(\varphi,\theta_r) = \frac{1}{g_h(\varphi,\theta_r)}[1+(S)+(S)^2+\cdots]; \text{ where } S = a_1 \cos\varphi \quad (22)$$

Note that $[g_h(\phi,\theta_r)]^{\pm(m_2)}$ has the same harmonic content as $g_h(\phi,\theta_r)$ for any $m_2 \in Z$, where $\epsilon$ is the set of all integers. This is considering the ideal rectangular nature of $g_h(\phi,\theta_r)$. Using identities (23) and (24), along with this harmonic invariance property of the air gap, the inverse air gap function for pure SE was expressed as (25).

$$\cos^m\varphi = \frac{1}{2^{m-1}}\Sigma_{k=0}^{\frac{m-1}{2}} m_{c_k}\cos\{(m-2k)\varphi\}; m = \text{odd} \quad (23)$$

$$\cos^m\varphi = \frac{1}{2^m}m_{c_{\frac{m}{2}}} + \frac{1}{2^{m-1}}\Sigma_{k=0}^{\frac{m}{2}-1}m_{c_k}\cos\{(m-2k)\varphi\}; m = \text{even} \quad (24)$$

Where $m_{c_k} = \frac{m!}{(k)!(m-k)!}$ and $m_{c_{\frac{m}{2}}} = \frac{m!}{\left(\frac{m}{2}\right)!\left(\frac{m}{2}\right)!}$ $$g_{se}^{-1}(\varphi,\theta_r) = \Sigma_{l=0,1,2,3...}^\infty \Sigma_{m=0,2p,4p,6p...}^\infty G_{selm} \cos(l\varphi \pm m\theta_r) \quad (25)$$

where $G_{selm}$ is a real number.
Multiplying this inverse air gap function with the permeability of air yielded the specific permeance function under SE condition, which was previously introduced in (7).

In case of pure dynamic eccentricity, $a_1$ vanishes and therefore (20) is modified to:

$$g_{de}(\phi,\theta_r)=g_h(\phi,\theta_r)[1-a_2\cos(\phi-\theta_r)] \quad (26)$$

For preventing stator-rotor rub or for maintaining possible running condition, 0≤$a_2$<1, which implied that $a_2 \cos(\phi-\theta_r)$<1. Thus, the inverse air gap function was represented as a binomial series $$g_{de}^{-1}(\varphi,\theta_r) = \frac{1}{g_h(\varphi,\theta_r)}[1+(D)+(D)^2+\cdots]; \text{ where } D = a_2\cos(\varphi-\theta_r) \quad (27)$$

Again using identities (23) and (24), and the harmonic preserving property of $[g_h(\phi,\theta_r)]^{\pm(m_2)}$, the inverse air gap function for pure DE was expressed as $$g_{de}^{-1}(\phi,\theta_r)=\Sigma_{m=0,1,2,3...} G_{dem}\cos\{m(\phi-\theta_r)\} \quad (28)$$

$G_{dem}$ is a real number.
Multiplying this inverse air gap function with the permeability of air yielded the specific permeance function under DE condition which was previously introduced in (12).

In case of mixed eccentricity, both $a_1$ and $a_2$ existed subject to the condition $0 \leq a_1 + a_2 < 1$, which implied: $a_1 \cos \phi + a_2 \cos(\phi - \theta_r) < 1$. Therefore, $g_{me}^{-1}(\phi, \theta_r)$ was also expressed as a binomial series:

$$g_{me}^{-1}(\varphi, \theta_r) = \frac{1}{g_h(\varphi, \theta_r)}[1 + (S + D) + (S + D)^2 + \cdots] \quad (29)$$

Using identities (23), (24) and (30), and the harmonic preserving property of $[g_h(\phi, \theta_r)]^{\pm(m_1)}$, the inverse air gap function for a ME machine was represented as in (31).

$$(S+D)m = \Sigma_{k=0}^m m_{C_k} S^{n-k} D^k \quad (30)$$

$$g_{me}^{-1}(\phi, \theta_r) = \Sigma_{l=0,1,2,3 \ldots}^\infty \Sigma_{m=0,1,2,3 \ldots}^\infty G_{melm} \cos(l\phi \pm m\theta_r) \quad (31)$$

$G_{melm}$ is a real number. Multiplying this inverse air gap function with the permeability of air, gave the specific permeance function under ME condition which was previously introduced in (15).

Example 3

(i) Motor Line Current Based Eccentricity Detection

Simulation Results

In order to simulate the performance of the machine under healthy, static, dynamic and mixed eccentric conditions, a state space model of a salient-pole synchronous machine was developed according to the coupled electromagnetic circuit based approach. The various inductances required in the state space model were computed using Modified Winding Function Approach (MWFA). The generic equation representing the inductance between any two windings computed using MWFA was given by (32).

$$L_{ab} = \mu_0 rl \left[ \int_0^{2\pi} n_a(\varphi, \theta_r).n_b(\varphi, \theta_r).g^{-1}(\varphi, \theta_r) d\varphi - 2\pi < N_a(\theta_r) > . < N_b(\theta_r) > . < g^{-1}(\varphi, \theta_r) > \right] \quad (32)$$

$$\text{where } <N_a(\theta_r)> = \frac{1}{2\pi <g^{-1}(\varphi, \theta_r)>} \int_0^{2\pi} n_a(\varphi, \theta_r).g^{-1}(\varphi, \theta_r) d\varphi \quad (33)$$

$$<N_b(\theta_r)> = \frac{1}{2\pi <g^{-1}(\varphi, \theta_r)>} \int_0^{2\pi} n_b(\varphi, \theta_r).g^{-1}(\varphi, \theta_r) d\varphi \quad (34)$$

$$<g^{-1}(\varphi, \theta_r)> = \frac{1}{2\pi} \int_0^{2\pi} g^{-1}(\varphi, \theta_r) d\varphi \quad (35)$$

$\mu_0$ is the permeability of air, r is the mean radius of the motor and l is the stack length of the motor.

The transient and steady state performances of the machine were then computed by feeding the values of these stored inductances and their derivatives into the state space model. MATLAB's inbuilt ODE45 solver was used to solve for different state variables. Then, the double sided Fast Fourier Transform (FFT) plots were obtained for the stator line current space phasors under healthy and eccentric conditions for identifying the harmonics.

Figure 4:
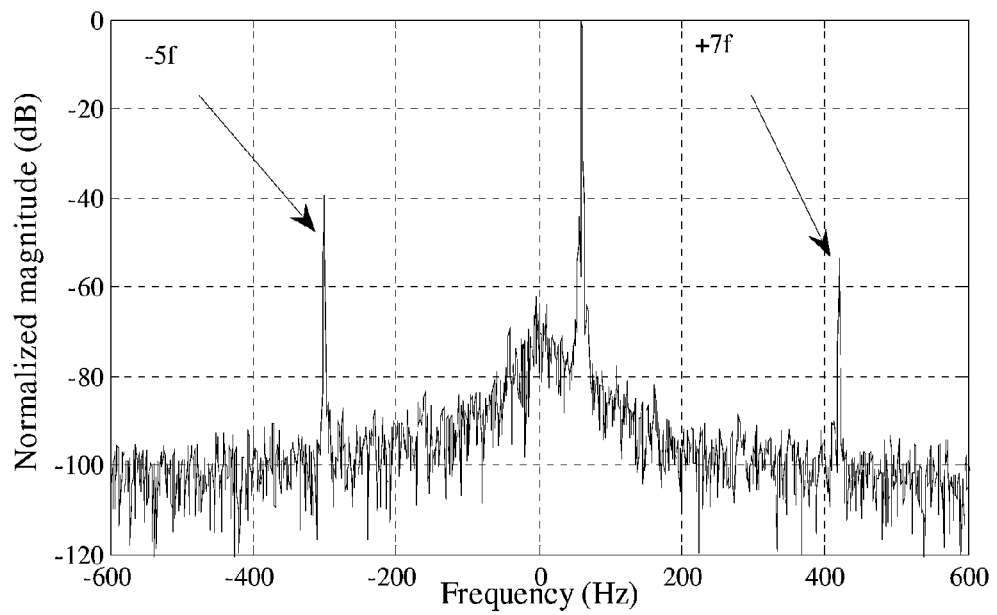
FIG. 4 illustrates a double sided FFT plot of the MWFA simulated stator line current space phasor of the healthy synchronous machine working at full load.

The double sided FFT of the stator line current space phasor of the healthy synchronous machine at full load, simulated using the above-mentioned MWFA technique has been shown in FIG. 4. As predicted by (6), the predominant harmonics in the healthy machine's stator line current were non-triplen odd harmonics such as −5f and +7f.

Figure 5:
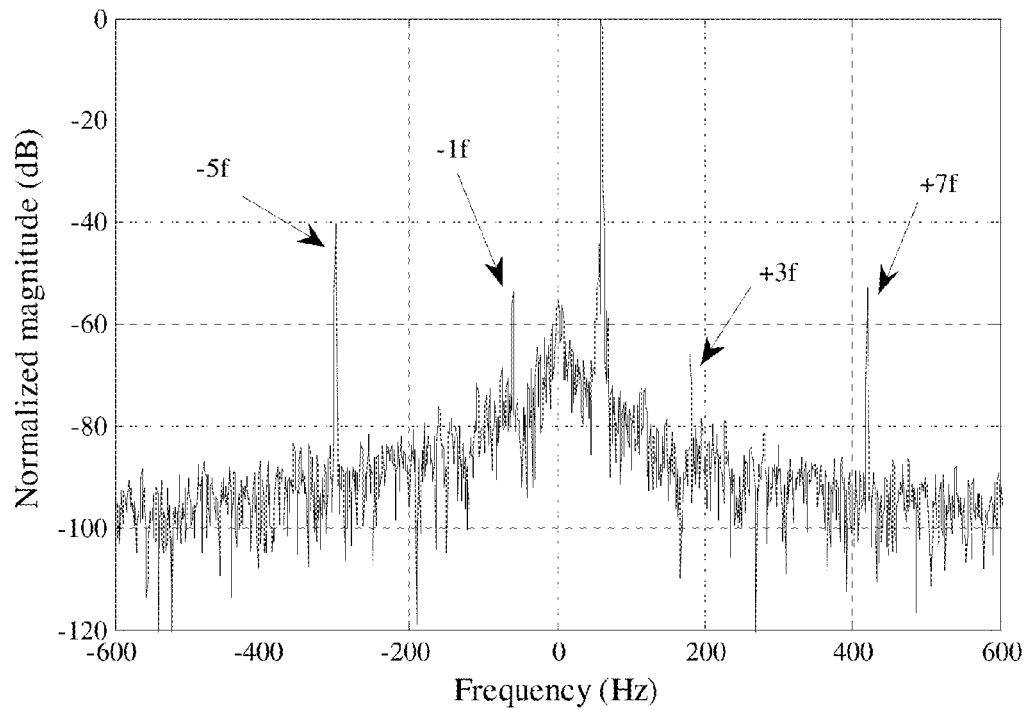
FIG. 5 contains the double sided FFT plot of the MWFA simulated stator line current space phasor of the 33.34% static eccentric synchronous machine working at full load.
Figure 6:
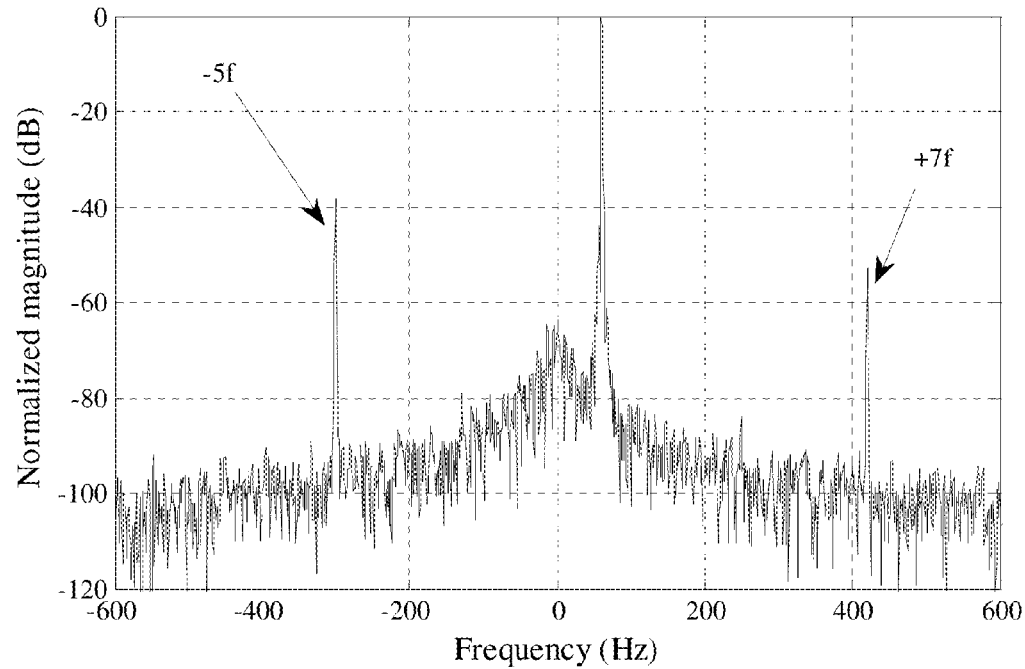
FIG. 6 contains the double sided FFT plot of the MWFA simulated stator line current space phasor of the 33.34% dynamic eccentric synchronous machine working at full load.
Figure 7:
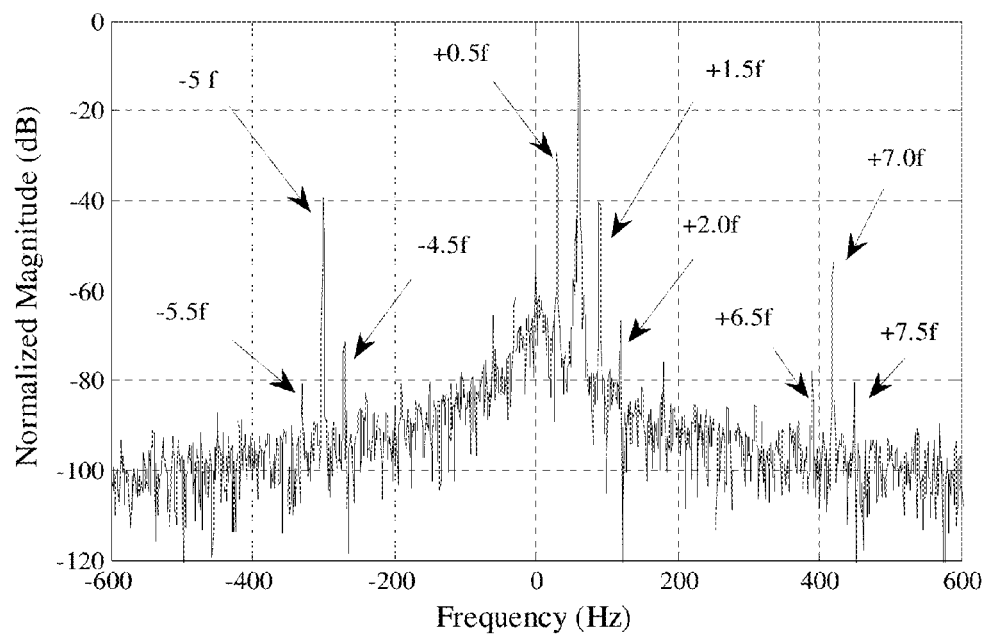
FIG. 7 contains the double sided FFT plot of the MWFA simulated stator line current space phasor of the 33.34% mixed eccentric synchronous machine working at full load.

Similarly, the static, dynamic and mixed eccentric cases, each of 33.34%, were also simulated using MWFA technique, for corroborating the theoretical results. FIG. 5 shows the double sided FFT of the stator line current space phasor of the static eccentric machine, simulated by MWFA technique. The line current spectrum showed the presence of triplen harmonics along with other odd harmonics, as predicted by (11). FIG. 6 shows the double sided FFT of the stator line current space phasor of the dynamic eccentric machine, again simulated by MWFA technique. The line current spectrum showed existence of only those haunonics which were originally present in the stator line current of the healthy machine, but their magnitudes were modified. This was in accordance with (14). FIG. 7 shows the double sided FFT of the stator line current space phasor of the mixed eccentric machine, simulated by MWFA technique. The line current spectrum was found to comprise of both even as well as odd harmonics. Moreover, the presence of side band components as predicted by (16) was also confirmed in these simulation results.

(ii) Experimental Results

A 3 phase, 3 hp, 208V, 4 pole, 60 Hz, star connected synchronous motor was used as the laboratory prototype for validating the proposed diagnostic scheme. The enclosure of the machine was modified so as to facilitate air gap measurements using feeler gauge. The bearings and end bells were also changed. Two sets of eccentric bushings, each offset by 16.67%, 33.33%, and 50% of the air gap, were used to obtain different combinations of SE, DE and ME conditions. The machine was fed from a three phase auto-transformer, whose input was supplied from a step down transformer with multiple tap settings on primary side. 10 seconds of steady state data of motor's line currents, field current and line to line voltages were acquired using a data acquisition system at 3600 Hz sampling frequency.

For certain types of rotating electric machines such as the salient pole synchronous machines, voltage unbalance, power supply harmonics, machine asymmetry etc. were found to have a significant impact on the detection of eccentricity fault. Hence, for implementing the proposed motor current signature analysis (MCSA) based eccentricity fault detection scheme experimentally, a suitable scheme for negating these factors was devised, and residues of the fault specific current harmonics under healthy condition were computed. Then these residues were removed from the measured current signatures. The resulting magnitude of the characteristic frequency component was used as the fault indicator. The stator line current space phasor residues $\overline{I_{s,res+}}$ and $\overline{I_{s,res-}}$ for positive and negative frequencies respectively were computed using (36) and (37). Voltage harmonic components, which had a significant magnitude, were used in the residue computation.

$$\overline{I_{s,res+}} = \overline{k_{0+}V_{1+}} + \overline{k_{1+}V_{1-}} + \overline{k_{2+}V_{3+}} + \overline{k_{3+}V_{3-}} + \ldots + \overline{k_{13+}V_{13+}} + \overline{k_{14+}V_{17-}} + \overline{k_{15+}V_{1.5+}} + \overline{k_{16+}V_{2+}} \quad (36)$$

$$\overline{I_{s,res-}} = \overline{k_{0-}V_{1+}} + \overline{k_{1-}V_{1-}} + \overline{k_{2-}V_{3+}} + \overline{k_{3-}V_{3-}} + \ldots + \overline{k_{13-}V_{13+}} + \overline{k_{14-}V_{17-}} + \overline{k_{15-}V_{1.5+}} + \overline{k_{16-}V_{2+}} \quad (37)$$

A complex two sided FFT of line current space phasor was obtained using the acquired data under healthy (HE), SE, DE and ME conditions at five different load conditions. At each load level, residues were computed using (36) and (37) for the fault specific frequency components using the prominent line voltage harmonics. For SE condition +9f (f is the stator frequency) component was chosen as fault indicating frequency; for DE condition +7f component was selected and for ME condition +2f component was used.

Figure 8:
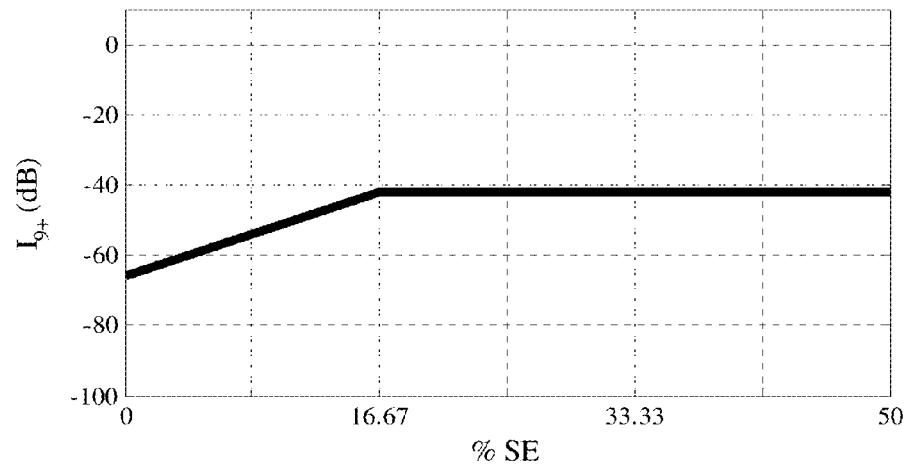
FIG. 8 shows the variation of the residue eliminated +9f component of the stator line current space phasor of the experimental synchronous machine for different levels of static eccentricity (SE) working at full load.
Figure 9:
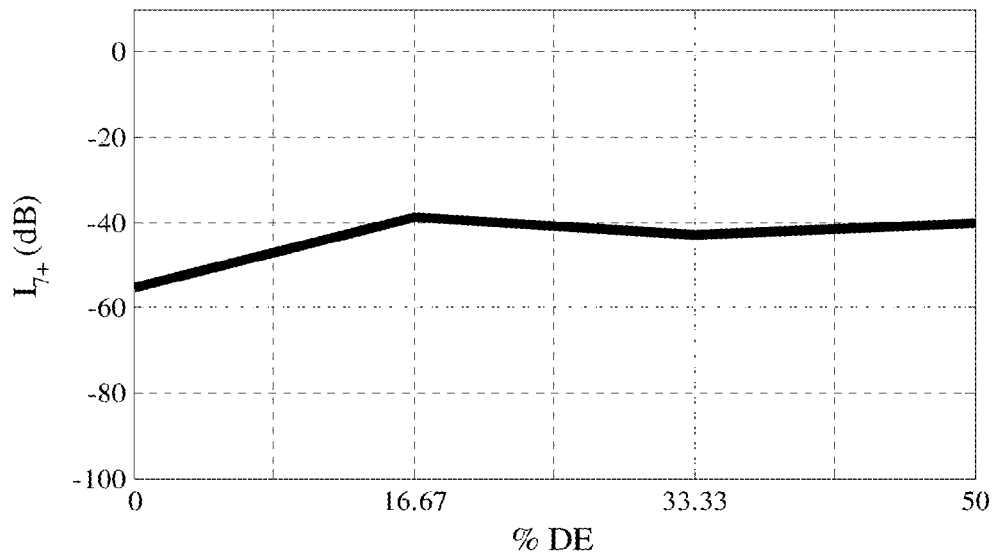
FIG. 9 shows the variation of the residue eliminated +7f component of the stator line current space phasor of the experimental synchronous machine for different levels of dynamic eccentricity (DE) working at full load.
Figure 10:
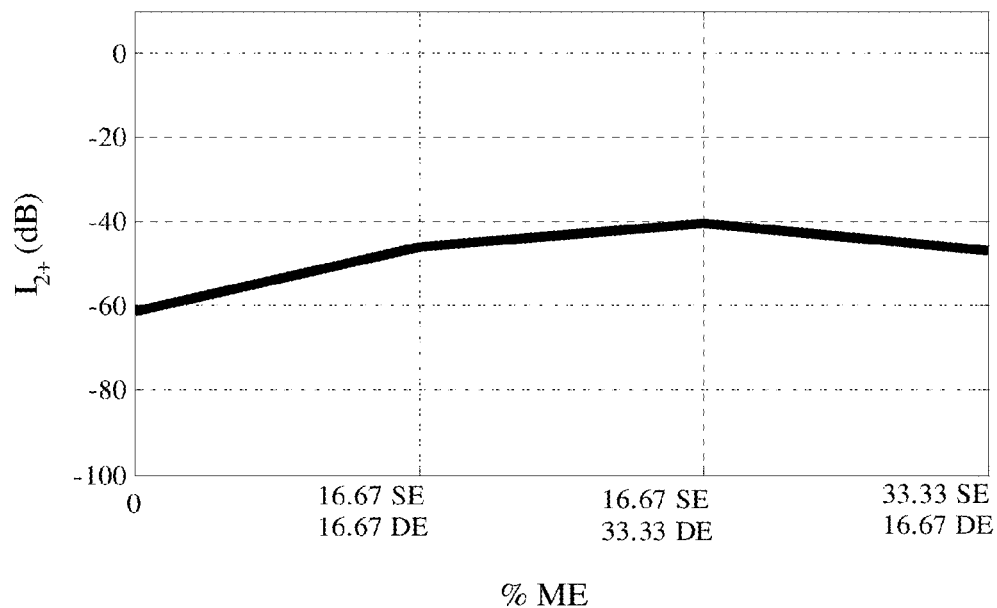
FIG. 10 shows the variation of the residue eliminated +2f component of the stator line current space phasor of the experimental synchronous machine for different levels of mixed eccentricity (ME) working at full load.

Variation of Fault Specific Frequency Component with Changing Levels of Eccentricity at Full Load The variation of the residue eliminated fault specific +9f component of the stator line current space phasor under different levels of static eccentric condition at full load is shown in FIG. 8. The variation of the residue eliminated +7f component of the stator line current space phasor under different levels of dynamic eccentric conditions at full load is shown in FIG. 9. FIG. 10 shows the variation of the residue eliminated +2f component of the stator line current space phasor under different levels of mixed eccentric conditions at full load. It is clear from FIGS. 8, 9 and 10 that low to moderate levels of any type of eccentricity were easily identified by monitoring the variation in the corresponding fault specific frequency in the motor line current spectrum.

Figure 11:
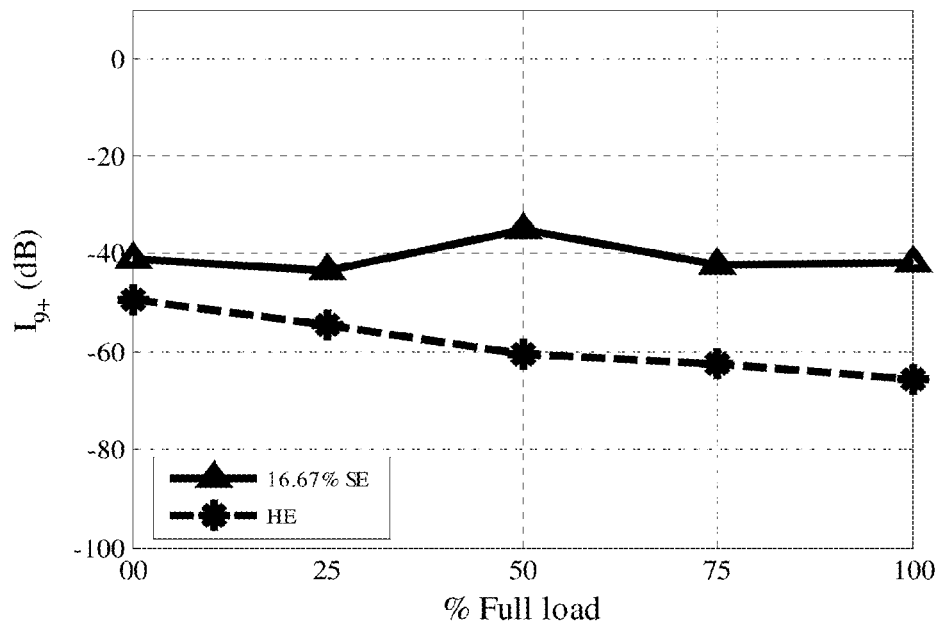
FIG. 11 contains the variation of the residue eliminated +9f component of the stator line current space phasor of the experimental synchronous machine for different levels of load working at 16.67% static eccentricity.
Figure 12:
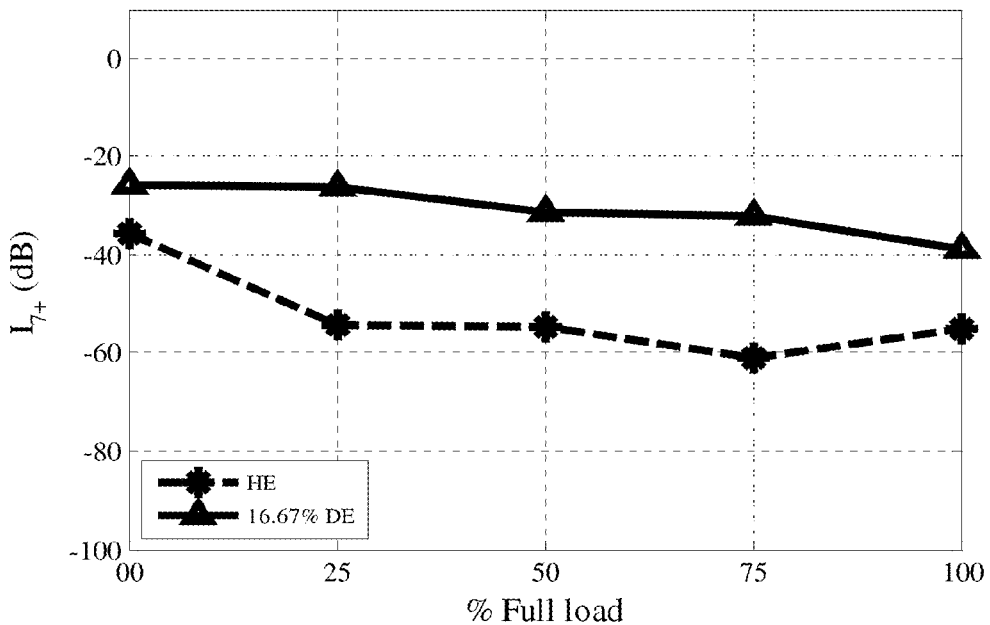
FIG. 12 contains the variation of the residue eliminated +7f component of the stator line current space phasor of the experimental synchronous machine for different levels of load working at 16.67% dynamic eccentricity.
Figure 13:
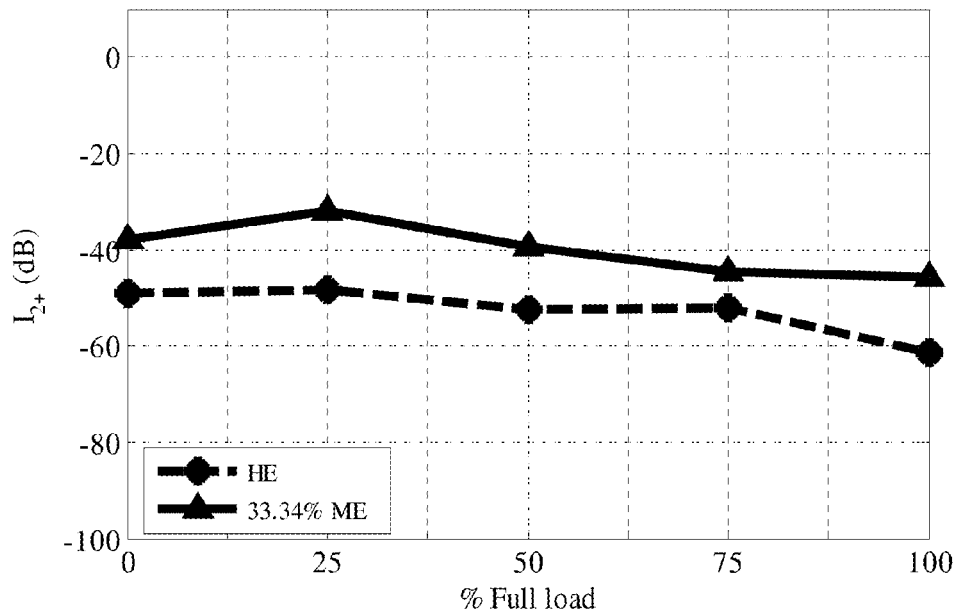
FIG. 13 contains the variation of the residue eliminated +2f component of the stator line current space phasor of the experimental synchronous machine for different levels of load working at 33.34% mixed eccentricity.

Variation of Fault Specific Frequency Component with Changing Levels of Load at Constant Level of Eccentricity The synchronous machine was run at healthy condition as well as under the influence of static, dynamic and mixed eccentricities at five different load levels for each case—no load, 25% full load, 50% full load, 75% full load and full load. The fault specific frequency components in the stator line current space phasor were monitored for all the cases and their variations were recorded after implementing the residue elimination. FIG. 11 shows the effect of load variation on +9f component of the stator line current space phasor under healthy and 16.67% static eccentric conditions. FIG. 12 shows the effect of load variation on +7f component of the stator line current space phasor under healthy and 16.67% dynamic eccentric conditions. FIG. 13 shows the effect of load variation on +2f component of the stator line current space phasor under healthy and 33.34% mixed eccentric conditions. At all load levels, the variation of the fault specific frequency components was found to be significantly larger with eccentricity. Hence, the proposed method was capable of monitoring eccentricity in the motor line current spectrum irrespective of the load variation.

Example 4

(i) Field Current Based Eccentricity Detection

Simulation Results

Figure 14:
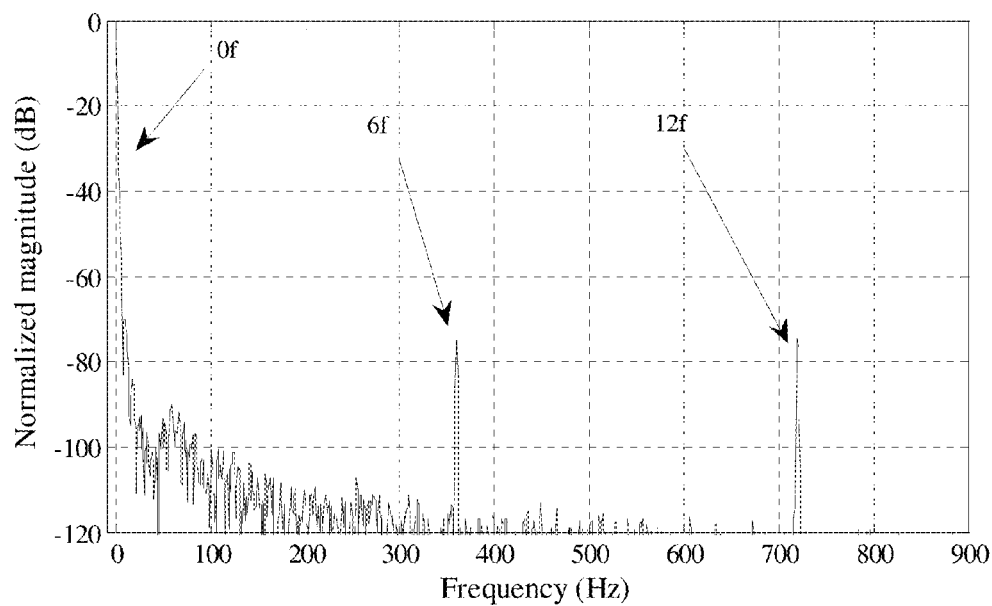
FIG. 14 contains the FFT plot of the MWFA simulated field current phasor of the healthy synchronous machine working at full load.

In rotating electric machines such as salient pole synchronous machines, where external field winding connections are available, characteristic fault components in the field currents can also be used for eccentricity detection. Then, the Fast Fourier Transform (FFT) plots are obtained for the field currents under healthy and eccentric conditions for identifying the harmonics. The FFT of the field current of the healthy synchronous machine at full load simulated using the above-mentioned MWFA technique has been shown in FIG. 14. As indicated by (1), the predominant harmonics in the healthy machine's field current were harmonics such as 0f, 6f, 12f.

Figure 15:
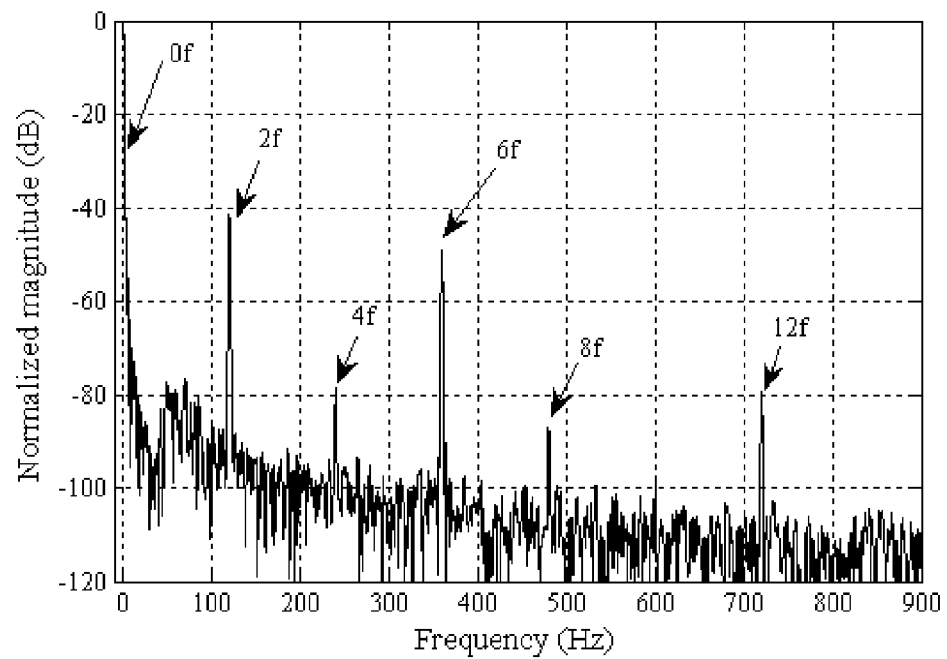
FIG. 15 contains the FFT plot of the MWFA simulated field current phasor of the 50% static eccentric synchronous machine working at full load.
Figure 16:
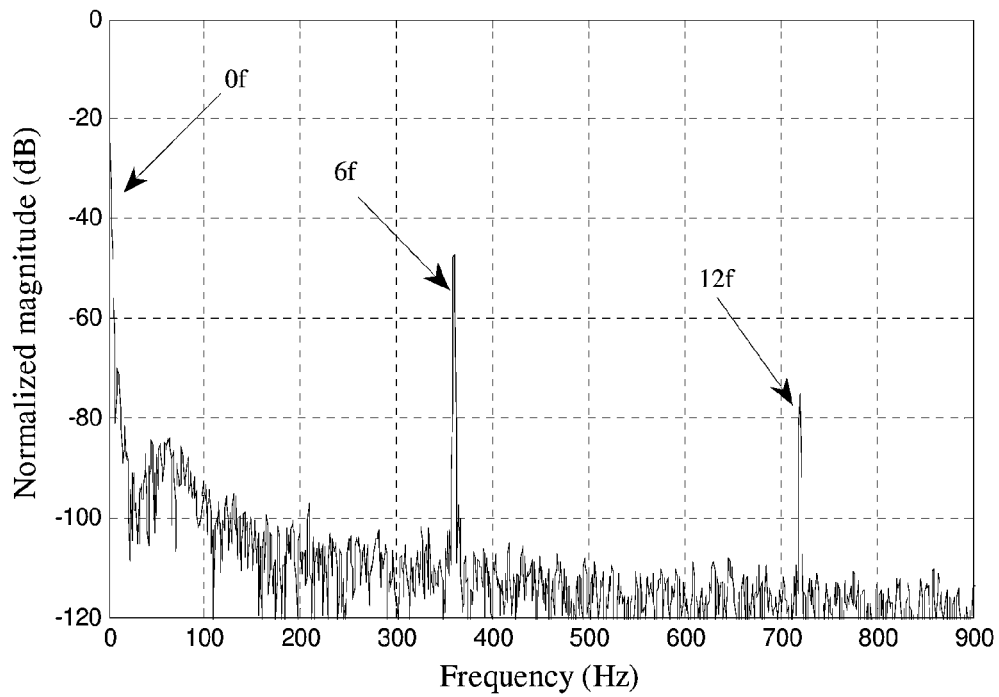
FIG. 16 contains the FFT plot of the MWFA simulated field current phasor of the 33.34% dynamic eccentric synchronous machine working at full load.
Figure 17:
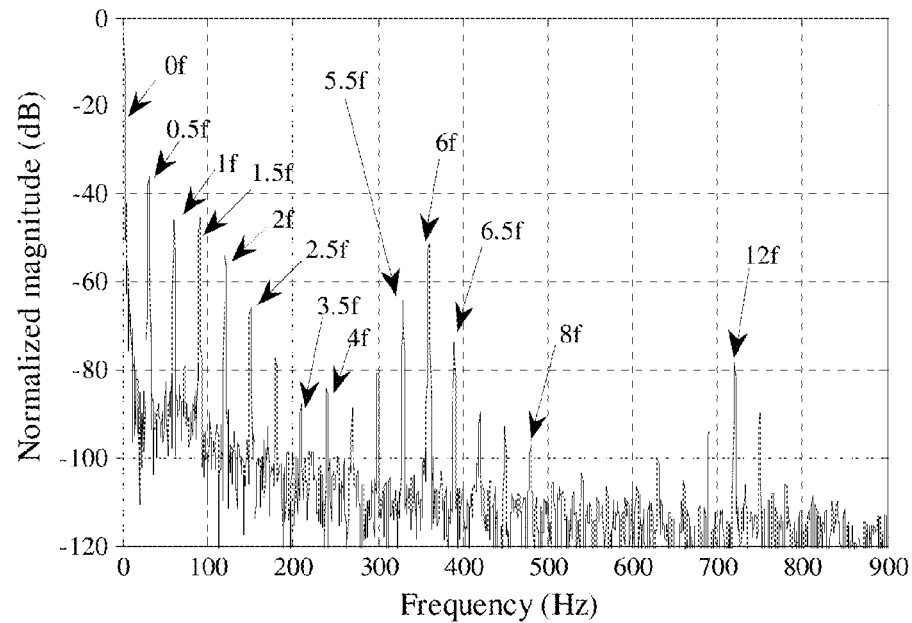
FIG. 17 contains the FFT plot of the MWFA simulated field current phasor of the 66.67% mixed eccentric synchronous machine working at full load.

Similarly, the static, dynamic and mixed eccentric cases were also simulated using MWFA technique, for corroborating the theoretical results. FIG. 15 shows the FFT of the field current of the 50% static eccentric machine, simulated by MWFA technique. The field current spectrum showed the presence of 2f, 4f, 8f etc. along with those harmonics present under healthy condition. FIG. 16 shows the FFT of the field current of the 33.34% dynamic eccentric machine, again simulated by MWFA technique. The field spectrum showed existence of only those harmonics which were originally present in the field current of the healthy machine, but their magnitudes were modified. FIG. 17 shows the FFT of the field current of the 66.67% mixed eccentric machine, simulated by MWFA technique. The field spectrum was found to comprise of both even as well as odd harmonics. Moreover, the presence of side band components was also confirmed in these simulation results. Table II shows the frequency components present in the field current spectrum corresponding to different eccentric conditions.

TABLE II

FIRST FEW HARMONIC COMPONENTS OF FIELD CURRENT UNDER DIFFERENT CONDITIONS

| HE | 0f | 6f | 12f | 18f | 24f | 30f |
|---|---|---|---|---|---|---|
| SE | 0f | 2f | 4f | 6f | 8f | 10f |
| DE | 0f | 6f | 12f | 18f | 24f | 30f |
| ME | 0f | 0.5f | 1f | 1.5f | 2f | 2.5f |

(ii) Experimental Results

For certain types of rotating electric machines such as salient pole synchronous machines, voltage unbalance, power supply harmonics, machine asymmetry etc. were found to have a significant impact on the detection of eccentricity fault. Hence, for implementing the proposed field current signature analysis (FCSA) based eccentricity fault detection scheme experimentally on such machines, a suitable scheme for negating these factors had to be devised. So the residues of the fault specific current harmonics under healthy condition were computed. Then these residues were removed from the measured field current signatures. The resulting magnitude of the characteristic frequency component was used as the fault indicator. The field current residues $\overline{I_{f,res}}$ for fault specific frequencies were computed using (38). Field current components, which had a significant magnitude, were used in the residue computation.

$$\overline{I_{f,res}} = \frac{\overline{k_{f0}}\overline{I_{f0}} + \overline{k_{f1}}\overline{I_{f2}} + \overline{k_{f2}}\overline{I_{f4}} + \ldots + \overline{k_{f7}}\overline{I_{f14}} + \overline{k_{f8}}\overline{I_{f16}} + \overline{k_{f9}}\overline{I_{f0.5}} + \overline{k_{f10}}}{\overline{I_{f1}}} \quad (38)$$

FFT of field current was obtained using the acquired data under healthy (HE), SE, DE and ME conditions at five different load conditions. At each load level, residues were computed using (38) for the fault specific frequency components using the prominent field current harmonics. For SE condition 4f (f is the stator frequency) component was chosen as fault indicating frequency; for DE condition 6f component was selected and for ME condition 3.5f component was used.

Figure 18:
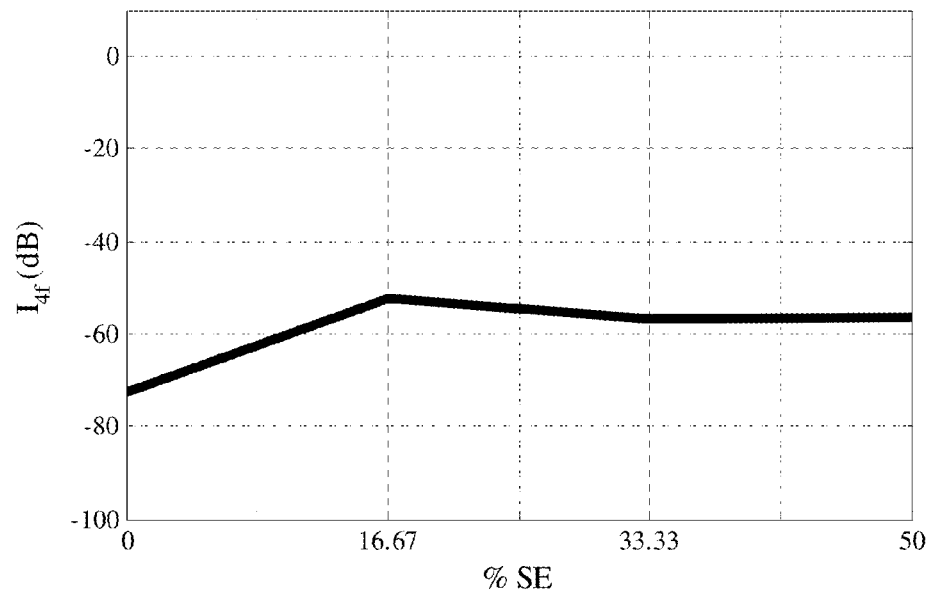
FIG. 18 shows the variation of the residue eliminated 4f component of the field current phasor of the experimental synchronous machine for different levels of static eccentricity working at full load.
Figure 19:
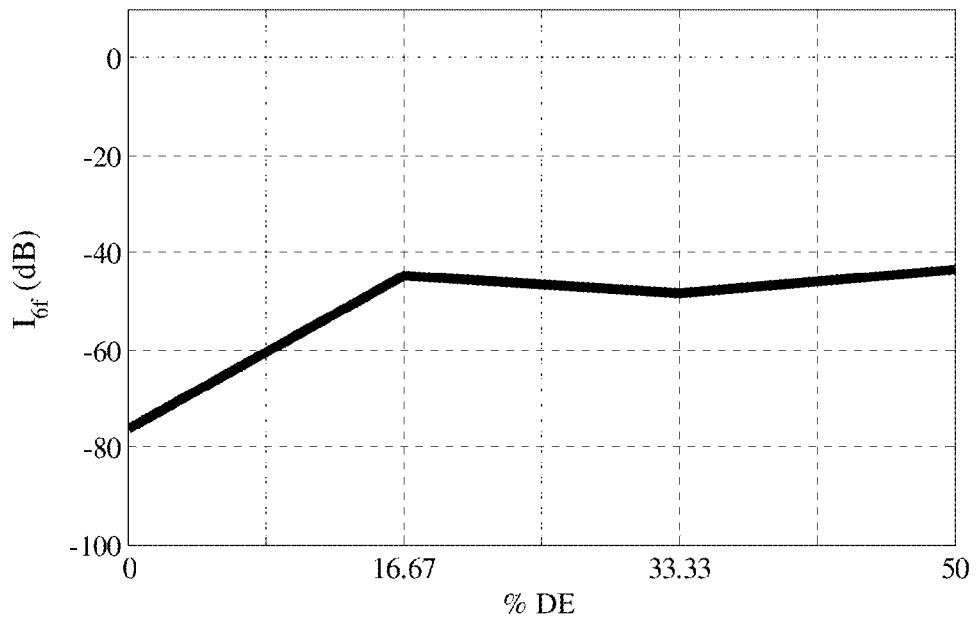
FIG. 19 shows the variation of the residue eliminated 6f component of the field current phasor of the experimental synchronous machine for different levels of dynamic eccentricity working at full load.
Figure 20:
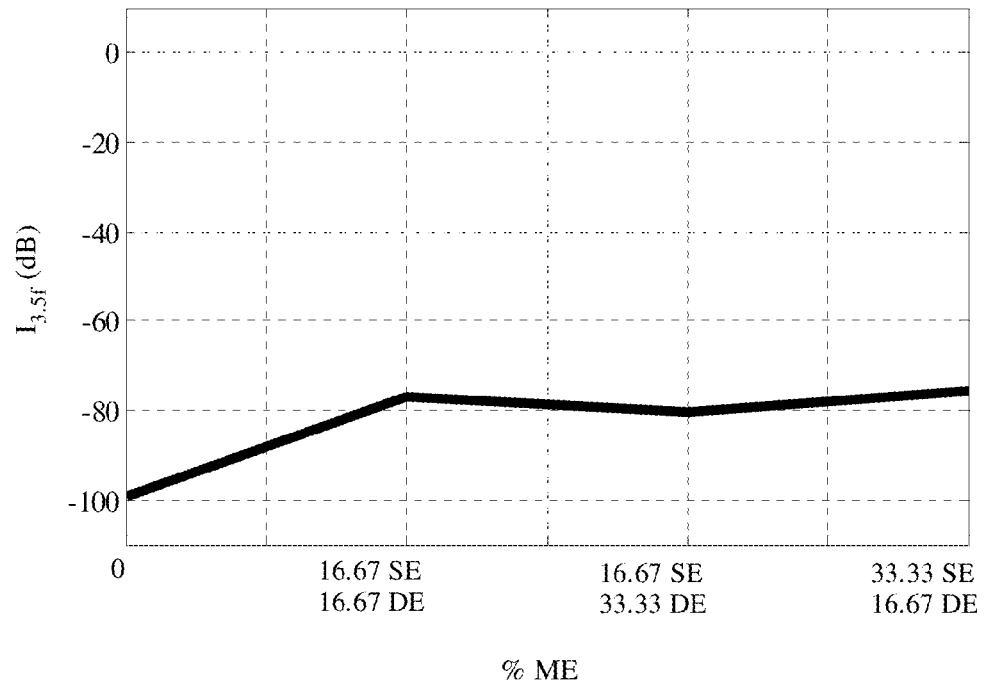
FIG. 20 shows the variation of the residue eliminated 3.5f component of the field current phasor of the experimental synchronous machine for different levels of mixed eccentricity working at full load.

Variation of Fault Specific Frequency Component with Changing Levels of Eccentricity at Full Load The variation of the residue eliminated fault specific 4f component of the field current under different levels of static eccentric condition at full load is shown in FIG. 18. The variation of the residue eliminated 6f component of the field current under different levels of dynamic eccentric conditions at full load is shown in FIG. 19. FIG. 20 shows the variation of the residue eliminated 3.5f component of the field current under different levels of mixed eccentric conditions at full load. It is clear from FIGS. 18, 19 and 20 that low to moderate levels of any type of eccentricity were easily identified by monitoring the variation in the corresponding fault specific frequency in the field current spectrum.

Figure 21:
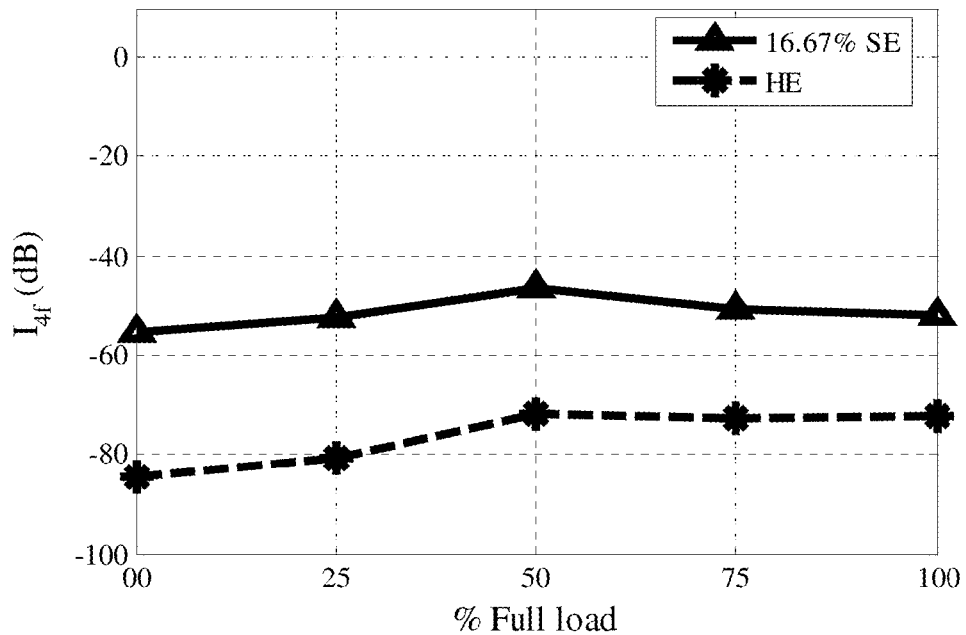
FIG. 21 contains the variation of the residue eliminated 4f component of the field current phasor of the experimental synchronous machine for different levels of load working at 16.67% static eccentricity.
Figure 22:
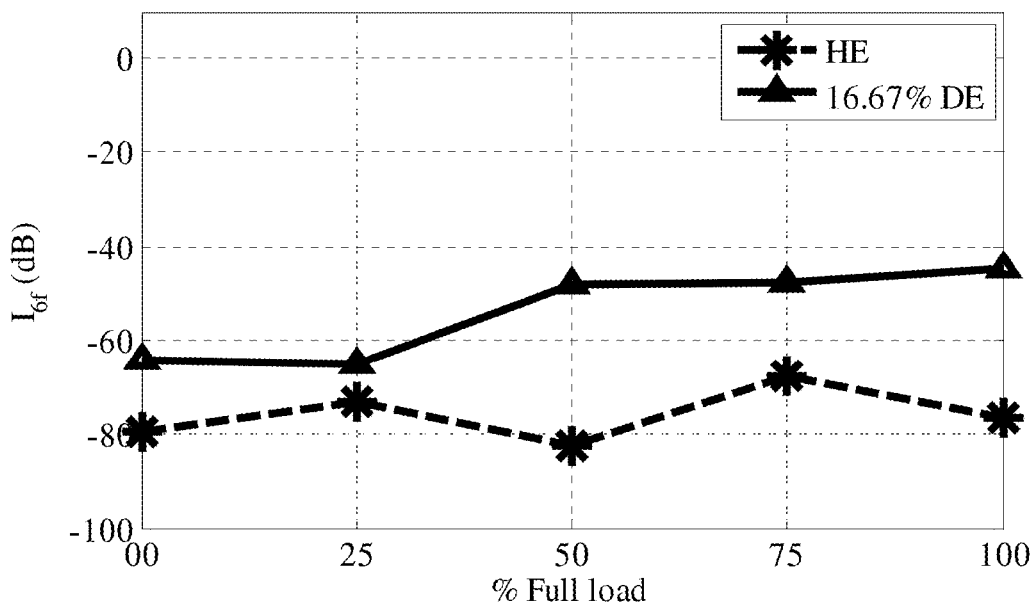
FIG. 22 contains the variation of the residue eliminated 6f component of the field current phasor of the experimental synchronous machine for different levels of load working at 16.67% dynamic eccentricity.
Figure 23:
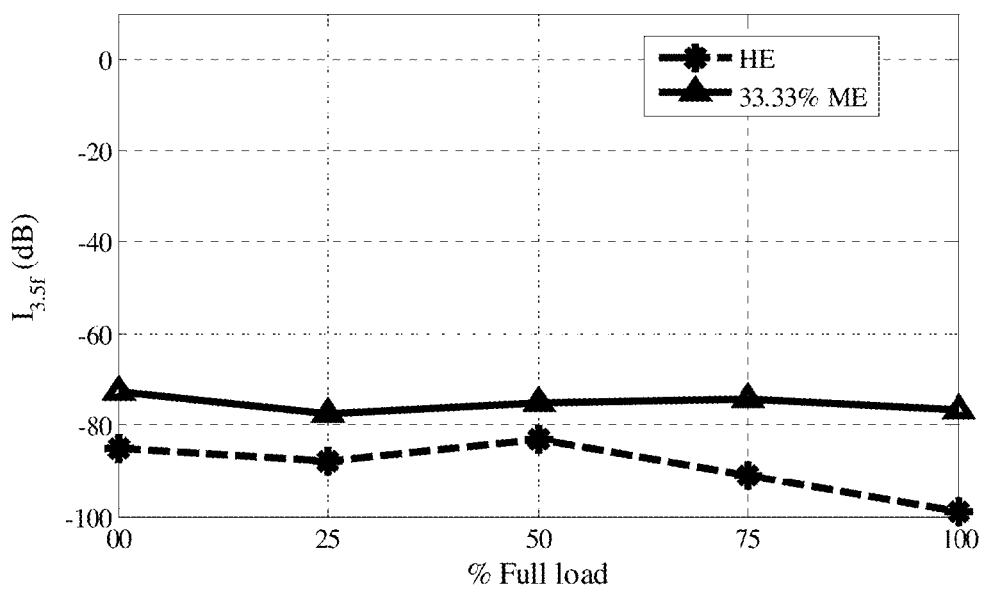
FIG. 23 contains the variation of the residue eliminated 3.5f component of the field current phasor of the experimental synchronous machine for different levels of load working at 33.34% mixed eccentricity.
Figure 24:
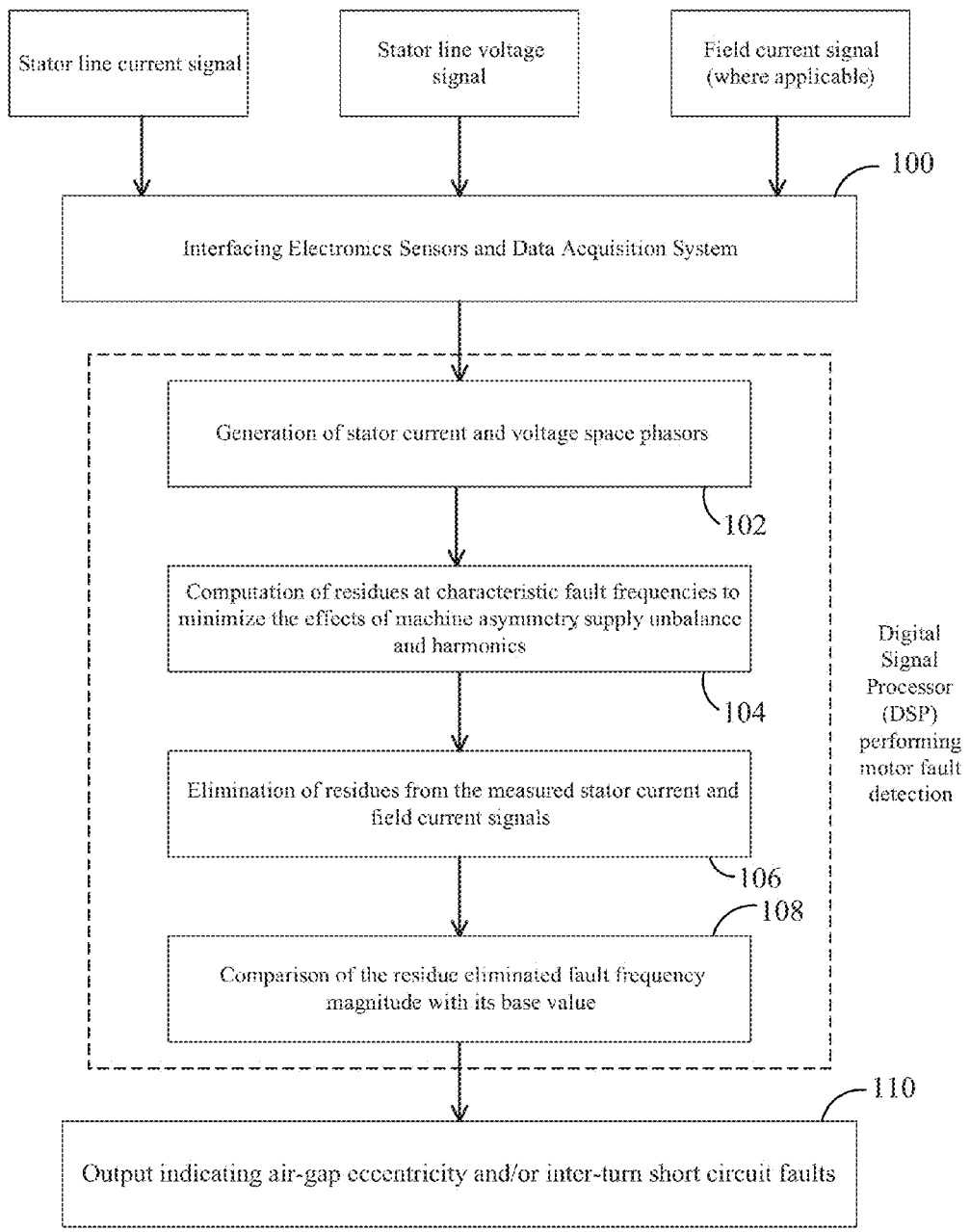
FIG. 24 is a block diagram of a representative system configured to detect air-gap eccentricity and/or inter-turn short circuit faults of multi-phase, multi-winding rotating electric machines.

Variation of Fault Specific Frequency Component with Changing Levels of Load at Constant Level of Eccentricity The synchronous machine was run at healthy condition as well as under the influence of static, dynamic and mixed eccentricities at five different load levels for each case—no load, 25% full load, 50% full load, 75% full load and full load. The fault specific frequency components in the field current were monitored for all the cases and their variations were recorded after implementing the residue elimination. FIG. 21 shows the effect of load variation on 4f component of the field current under healthy and 16.67% static eccentric conditions. FIG. 22 shows the effect of load variation on 6f component of the field current under healthy and 16.67% dynamic eccentric conditions. FIG. 23 shows the effect of load variation on 3.5f component of the field current under healthy and 33.34% mixed eccentric conditions. At all load levels, the variation of the fault specific frequency components was found to be significantly larger with eccentricity. Hence, the proposed method was capable of monitoring eccentricity in the motor field current spectrum irrespective of the load variation.

In case of inter-turn short circuit faults on the multi-phase stationary stator winding of the rotating electric machines, the fault specific frequency components existing in the motor line currents are exactly similar to those in case of static eccentricity fault. Under short-circuit faults also modulations of the amplitude of these fault specific components occur. These modulations can be rise, fall, presence and/or absence of the fault specific components. Thus, the proposed scheme can be extended for diagnosing stator inter-turn faults also.

We claim:

1. A method of detecting faults in an operating multi-phase electric machine, comprising:
    measuring a stator current, a field current, or both a stator current and a field current with the operating multi-phase electric machine under load;
    determining a spectral magnitude at a selected fault frequency based on at least one the stator current and a field current, wherein the selected fault frequency is given by $$f_{fault} = \left(n \pm 6h \pm \frac{km}{p}\right)f,$$

wherein n=1, 5, 7, 11, 13 ... for stator currents, and 0 for field current, m is a non-negative even integer for static eccentricity, m is 0 for dynamic eccentricity, m is a positive integer for mixed eccentricity, p is a fundamental pole pair number, f is a stator line frequency, and k and h are non-negative integers; and
    indicating an air gap eccentricity fault, a stator inter-turn fault, or both in the multi-phase electric machine based on the determined spectral magnitude and the selected fault frequency.

2. The method of claim 1, further comprising applying a residue correction to the spectral magnitude, wherein the indicated fault is determined based on the residue-corrected spectral magnitude.

3. The method of claim 2, wherein the residue correction is based on spectral characteristics corresponding to a non-eccentric multi-phase machine.

4. The method of claim 1, wherein the spectral magnitude is associated with a frequency associated with a dynamic eccentricity, and the residue correction is based on a spectral magnitude corresponding to an air gap lacking static eccentricity.

5. The method of claim 1, wherein the indicated fault is associated with an air gap eccentricity.

6. The method of claim 5, wherein the indicated fault is associated with a dynamic air gap eccentricity.

7. The method of claim 5, wherein the indicated fault is a static air gap eccentricity.

8. The method of claim 5, wherein the indicated fault is a mixed static and dynamic air gap eccentricity.

9. The method of claim 1, wherein the indicated fault is associated with an inter-turn short circuit.

10. The method of claim 1, further comprising selecting a fault frequency based on fault to be identified.

11. The method of claim 10, further comprising selecting fault frequencies associated with at least one of a static eccentricity, a dynamic eccentricity, and a mixed eccentricity.

12. The method of claim 1, wherein at least the field current is measured, and the spectral magnitude at the selected fault frequency is based on at least one field current.

13. A method of detecting faults in an operating multi-phase electric machine, comprising:
    measuring a stator current, a field current, or both a stator current and a field current with the operating multi-phase electric machine under load;
    determining a spectral magnitude at a selected fault frequency based on at least one of a stator current and a field current; and
    indicating an air gap eccentricity fault, a stator inter-turn fault, or both in the multi-phase electric machine based on the determined spectral magnitude and the selected fault frequency, wherein the selected fault frequency is given by $$f_{fault} = \left(n \pm 6h \pm \frac{km}{p}\right)f,$$

wherein n=1, 5, 7, 11, 13 ... for stator currents, and 0 for field current, m is a non-negative even integer for static eccentricity, m is 0 for dynamic eccentricity, m is a positive integer for mixed eccentricity, p is a fundamental pole pair number, f is a stator line frequency, and k and h are non-negative integers.

14. At least one computer-readable storage device comprising computer executable instructions stored on a non-transitory computer-readable medium for the method of claim 13.

15. An apparatus, comprising:
    interface electronic sensors operable to receive at least one of a stator current signal or a field current signal from an induction machine; and
    a signal processor configured to calculate a spectral magnitude associated with at least one of a stator current or a field current of the operating induction machine under load at at least one predetermined frequency, and based on the estimated spectral magnitude, indicate at least one of a static eccentricity, a dynamic eccentricity, and a mixed eccentricity, wherein the predetermined frequency is given by at least one of $$f_{fault} = \left(n \pm 6h \pm \frac{km}{p}\right)f,$$

wherein n=1, 5, 7, 11, 13 ... for stator currents, and 0 for field current, m is a non-negative even integer for static eccentricity, m is 0 for dynamic eccentricity, m is a positive integer for mixed eccentricity, p is a fundamental pole pair number, f is a stator line frequency, and k and h are non-negative integers.

16. The apparatus of claim 15, wherein the signal processor is configured to identify at least one of a static eccentricity, a dynamic eccentricity, and a mixed eccentricity based on the spectral magnitude and frequency.

17. The apparatus of claim 16, wherein the signal processor is configured to obtain a Fourier transform of the electrical signal and estimate the spectral magnitude based on the Fourier transform.

18. The apparatus of claim 16, wherein the signal processor is configured to estimate a contribution of an eccentric condition to the spectral magnitude based on a contribution associated with a non-eccentric condition.

19. The apparatus of claim 15, wherein the signal processor is configured to estimate spectral magnitudes at fault frequencies associated with static eccentricity, a dynamic eccentricity, and a mixed eccentricity.

20. The apparatus of claim 15, further comprising a signal conditioner configured to couple an electrical signal associated with at least one of the stator current and the field current to the signal processor.

21. The apparatus of claim 20, where the signal conditioner is configured to couple the electrical signal associated with at least one of the stator current and the field current to the signal processor as a digitized electrical signal.

22. The apparatus of claim 15, wherein the signal processor is configured to estimate the spectral magnitude associated with at least one of the stator current and the field current based on a stator voltage.

23. A method, comprising:
with a signal processor, obtaining a spectral magnitude associated with at least one of a stator current and a field current in an operating motor under load; and
with the signal processor, based on the spectral magnitude and at least one fault frequency, identifying an eccentricity type in a motor, wherein the at least one fault frequency is given be $$f_{fault} = \left(n \pm 6h \pm \frac{km}{p}\right)f,$$

wherein n=1, 5, 7, 11, 13 . . . , for stator currents, and 0 for field current, m is a non-negative even integer for static eccentricity, m is 0 for dynamic eccentricity, m is a positive integer for mixed eccentricity, p is a fundamental pole pair number, f is a stator line frequency, k and h are non-negative integers.

24. An apparatus, comprising:
interface electronic sensors operable to receive at least one of a stator current signal or a field current signal from an electric machine; and
a signal processor configured to estimate a spectral magnitude associated with at least one of a stator current and a field current of an operating induction machine under load, and based on the estimated spectral magnitude, identify at least one of a static eccentricity, a dynamic eccentricity, and a mixed eccentricity, wherein the signal processor is configured to estimate spectral magnitudes at fault frequencies associated with static eccentricity, a dynamic eccentricity, and a mixed eccentricity, wherein the fault frequencies include at least one of $$f_{fault} = \left(n \pm 6h \pm \frac{km}{p}\right)f,$$

wherein n=1, 5, 7, 11, 13 . . . , for stator currents, and 0 for field current, m is a non-negative even integer for static eccentricity, m is 0 for dynamic eccentricity, m is a positive integer for mixed eccentricity, p is a fundamental pole pair number, f is a stator line frequency, and k and h are non-negative integers.

* * * * *